(12) United States Patent
Stern et al.

(10) Patent No.: US 7,000,159 B2
(45) Date of Patent: Feb. 14, 2006

(54) SYSTEM AND METHOD FOR TESTING MEMORY

(75) Inventors: Jonathan T. Stern, Round Rock, TX (US); Marc D. Alexander, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 501 days.

(21) Appl. No.: 10/385,228

(22) Filed: Mar. 10, 2003

(65) Prior Publication Data

US 2004/0181716 A1    Sep. 16, 2004

(51) Int. Cl.
*G11C 29/00*    (2006.01)

(52) U.S. Cl. ........................................ 714/718; 714/14

(58) Field of Classification Search ............... 714/9, 714/36, 719, 718, 14; 713/2; 711/153

See application file for complete search history.

(56) References Cited

U.S. PATENT DOCUMENTS

| | | | |
|---|---|---|---|
| 5,325,365 A | 6/1994 | Moore et al. ............... 371/16.2 |
| 5,621,883 A * | 4/1997 | Thoulon et al. ............... 714/9 |
| 5,659,748 A | 8/1997 | Kennedy ..................... 395/652 |
| 5,675,795 A * | 10/1997 | Rawson et al. ................ 713/2 |
| 5,860,001 A | 1/1999 | Cromer et al. .............. 395/651 |
| 6,009,541 A * | 12/1999 | Liu et al. ....................... 714/36 |
| 6,158,000 A | 12/2000 | Collins .......................... 713/1 |
| 6,216,226 B1 | 4/2001 | Agha et al. ..................... 713/2 |
| 6,347,372 B1 * | 2/2002 | Takashima et al. ............ 713/2 |
| 6,385,721 B1 * | 5/2002 | Puckette ........................ 713/2 |
| 6,434,696 B1 | 8/2002 | Kang ............................. 713/2 |
| 6,697,920 B1 * | 2/2004 | Nijhawan et al. ............ 711/153 |
| 6,877,118 B1 * | 4/2005 | Oshima et al. ............. 714/719 |

* cited by examiner

*Primary Examiner*—David Ton
(74) *Attorney, Agent, or Firm*—Baker Botts L.L.P.

(57) ABSTRACT

A system and method for reducing the amount of time for a boot operation is provided that includes a test management module that divides the memory into multiple test blocks and then selects a limited number of test blocks to test during a boot operation, thereby decreasing the overall amount of memory test time.

20 Claims, 2 Drawing Sheets

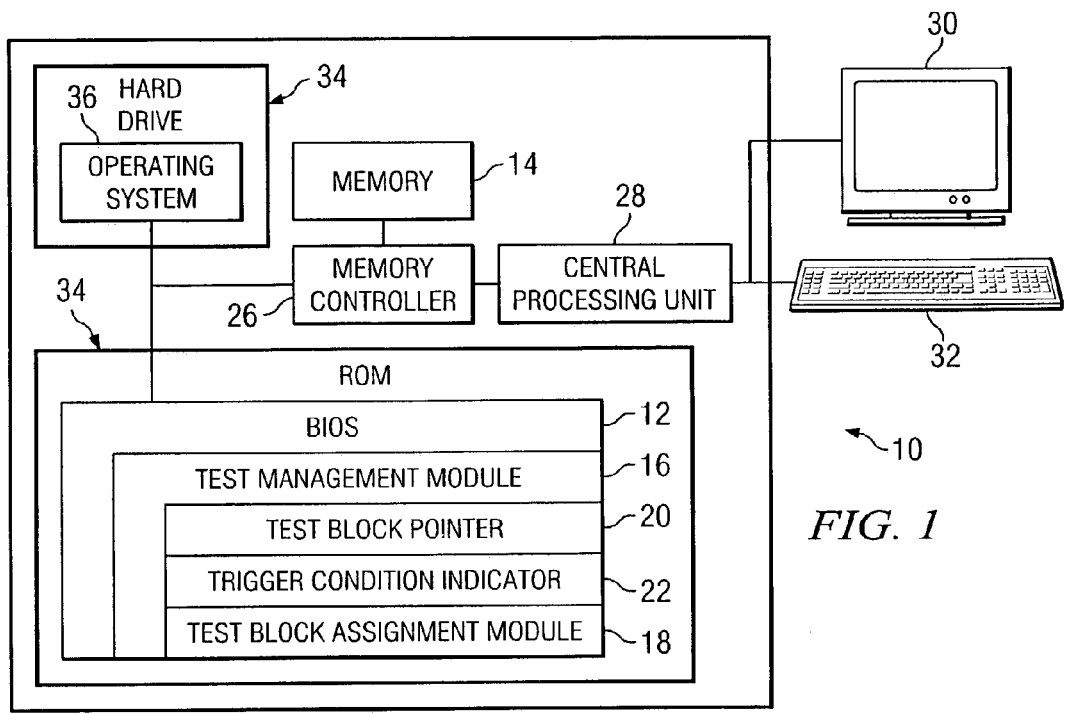
FIG. 1
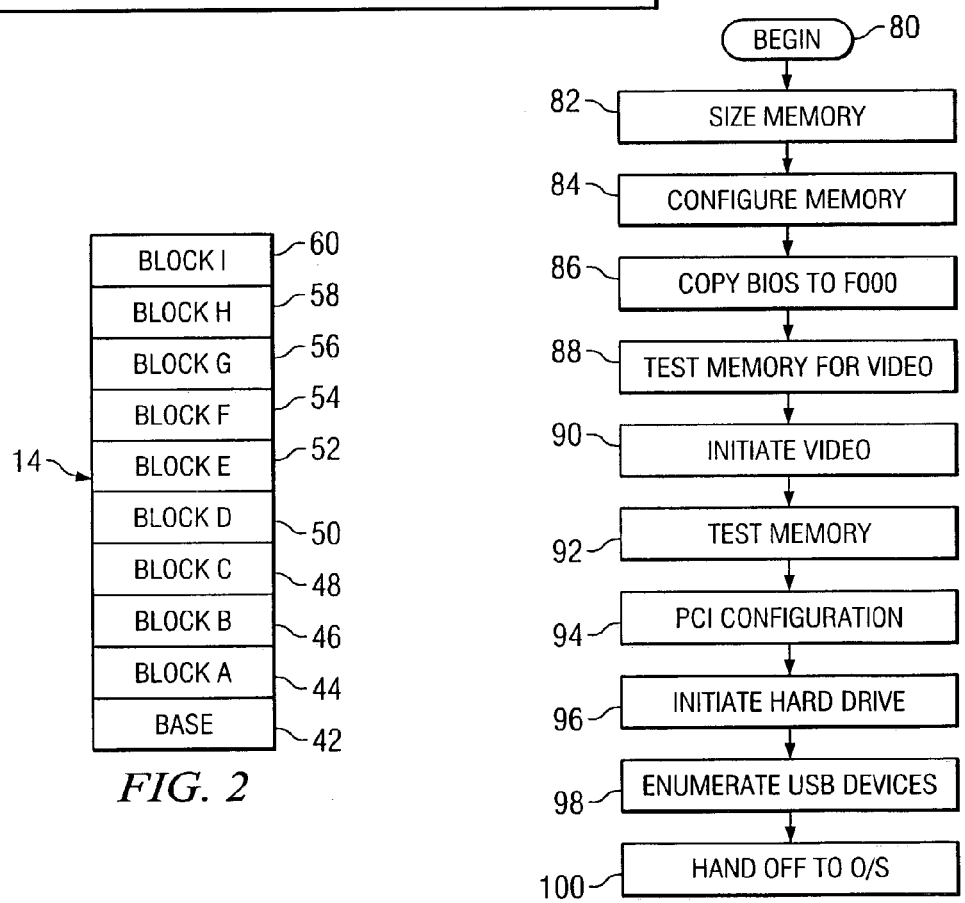
FIG. 2
FIG. 3

SYSTEM AND METHOD FOR TESTING MEMORY

TECHNICAL FIELD

This invention relates in general to information systems and more particularly to a system for testing memory that decreases memory test time during a boot operation.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Memory is a key feature of an information handling system. As time and technology progress, the amount of memory required and utilized by information handling systems continues to increase in size. More memory allows users to run larger programs and store larger amounts of information.

During the initialization of the information handling system, a basic input/output system (BIOS) executes a power-on self-test (POST) routine that tests the memory's stability and integrity. After the POST routine is completed, the operating system is loaded and the system is ready for use.

The amount of time it takes to test the memory in an information handling system is typically a linear function based on the size of the memory being tested. As the amount of system memory increases, the amount of time for memory testing increases proportionally. Current memory testing tests all of the system's random access memory during each boot operation.

Memory testing with conventional methods has the disadvantage of taking too much time. As the amount of memory increases, the delay before testing is complete and an operating system loads increases. Because users desire short boot times and find long boots inconvenient, this delay can be unacceptably long to users and can reflect negatively on the information handling system as a whole. Also, software developers desire minimal boot times and provide incentives to information handling system manufacturers that produce favorable boot times.

SUMMARY

Therefore, a need has arisen for a system and method which decreases the time to complete a boot operation in an information handling system.

A further need exists for a system and method for decreasing memory test times.

In accordance with the teachings of the present disclosure, a system and method for reducing the amount of time for a boot operation is provided that substantially reduces disadvantages and problems associated with previously developed memory testing systems and methods. The system includes a test management module that divides the memory into multiple test blocks and then selects a limited number of test blocks to test during a cold boot operation, thereby decreasing the memory test time.

In one aspect, an information handling system is disclosed that includes a basic input output system (BIOS) and a memory. The BIOS is in communication with the memory and can test the memory. The BIOS also has a test management module able to divide the memory into a base block and multiple memory test blocks. The test management module tests the base block and a selected memory test block. More specifically, the memory is random access memory (RAM) and the memory testing includes data testing and address testing.

In another aspect of the present disclosure, a method to decrease boot time in an information handling system includes dividing a memory into a base memory block and multiple test memory blocks. Next, one of the memory test blocks is selected for testing. The method also includes the step of testing the base memory block and testing the selected memory test block.

In a particular embodiment, the method includes determining whether a trigger condition exists and reading a test block pointer to identify the next sequential test memory block to test. Where a trigger condition is determined, the method includes testing all of the memory test blocks and setting the pointer to the first memory test block.

The present invention provides a number of important technical advantages. One technical advantage is dividing a memory into a base memory block and sequential test memory blocks. This reduces the amount of memory tested during each boot operation, thereby reducing the overall time of boot operations, including POST routines. Further advantages of the present disclosure are described in the description, FIGURES, and claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a diagram of an information handling system including a test management module according to teachings of the present disclosure;

FIG. 2 is a diagram of a memory divided into a base memory block and a series of test memory blocks;

FIG. 3 is a flow diagram showing representative steps of a boot operation; and

DETAILED DESCRIPTION

Figure 4:
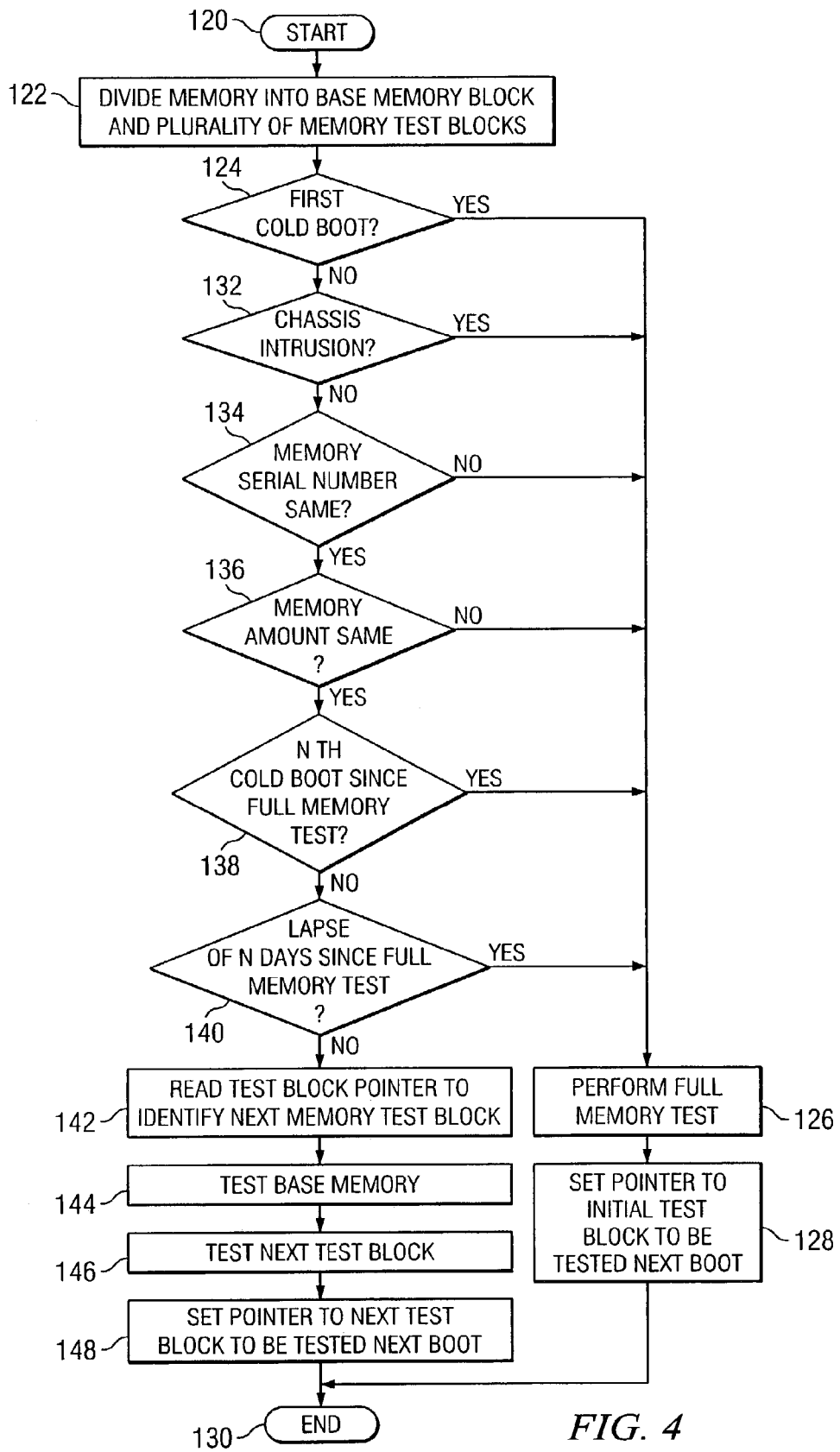
FIG. 4 is a flow diagram showing a method for decreasing boot time in a boot of an information handling system according to teachings of the present disclosure.

Preferred embodiments and their advantages are best understood by reference to FIGS. 1 through 4, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various components.

Now referring to FIG. 1, an illustration of information handling system 10 is shown. Information handling system 10 includes BIOS 12 and memory 14. BIOS 12 is the basic input/output system of information handling system 10. BIOS 12 serves as an intermediary between the operating software (such as operating system 36) and hardware (such as memory 14). BIOS 12 may be permanently contained in a read only memory (ROM) chip 24. When information handling system 10 is turned on, BIOS 12 runs a Power On Self Test (POST) routine (as described below with respect to FIG. 3). After completion of the POST routine, BIOS 12 preferably hands off to operating system 36. During the POST routine, the BIOS preferably performs data testing and address testing on memory 14.

Memory 14 provides data storage for information handling system 10. In the present preferred embodiment memory 14 is random access memory (RAM). Memory 14 may be dynamic random access memory (DRAM), extended Data Out random access memory (EDO RAM), video random access memory (VRAM), Static random access memory (SRAM), synchronous DRAM (SDRAM), single in-line memory modules (SIMM), dual in-line memory modules (DIMM), error correcting code (ECC) or any other suitable data storage medium. Memory 14 may encompass a single component (such as a single microchip) or multiple memory components.

In the example embodiment, information handling system 10 may further include respective software components and hardware components, such as read only memory (ROM) chip 24, memory manager/controller 26, central processing unit (CPU) 28, display 30, keyboard 32, hard drive 34, and operating system 36. Information handling system 10 may further include expansion cards, memory chips, processors, dip switches, jumper pins, input/output port, capacitors, resistors, pin connectors as well as any other appropriate computer hardware. The various hardware and software components may also be referred to as processing resources.

BIOS 12 contains test management module 16. Test management module 16 includes test block assignment module 18, test block pointer 20 and trigger condition indicator 22.

Test management module 16 tests memory 14. In the present preferred embodiment, test management module 16 performs both data testing and address testing on memory 14. Test management module 16 performs data testing on memory 14 by writing a series of data points on the memory. Test management module 16 then reads back the data, comparing the data pattern it wrote to the data pattern it read. If the data patterns are the same, then the memory is functioning correctly. Test management module 16 performs address testing by sending a message to a particular memory address. Then test management module 16 reads the data from the address where the data was sent. If the correct data pattern is found at the correct location, the memory's address is determined to function properly. In alternative embodiments, test management module may perform alternative or additional memory testing.

Test block assignment module 18 divides memory 14 into a base memory block 42 and plurality of test memory blocks (for example, blocks A–Z as shown in FIG. 2). Base memory block 42 is preferably the first portion of memory 14 and has a preselected size. In some embodiments, base memory 42 may store all or a portion of the system's operating system.

Test block pointer 20 records the most recently tested memory test block and indicates the next test block slated for testing. For example, if during the last cold boot, memory block C 48 was tested, then test block pointer 20 records that test memory block C 48 was tested and that test memory block D 50 will be tested during the cold boot operation. If block I 60 was the last block tested, then test block pointer 20 indicates test memory block I 60 was the last block tested and that test block A 44 should be tested during the next boot operation. Test block pointer 20 operates by communicating with test management module 16. Test management module 16 tests the selected test memory block. Then test management module 16 sends a signal to test block pointer 20 communicating the last selected test memory block tested. Test block pointer 20 then records this information.

Trigger condition indicator 22 determines if a trigger condition (as described below in FIG. 4) exists. If a trigger condition exists, test management module 16 proceeds to test base memory block 42 and all test memory blocks A–I (44–60). If no trigger condition exists, test management module 16 tests base memory block 42 and the next sequential test memory block indicated by test block pointer 20. In this manner, during multiple boot operations where no trigger condition exists, test management module 16 will eventually test all memory blocks A–I (44–60).

In an alternate embodiment, test block pointer 20 identifies the last-tested memory block. During a boot operation, test management module 16 reads the last-test memory block from memory test block pointer 16 and then determines the next sequential test block for testing. Test management module 20 then preferably resets test block pointer 20 to indicate the most recently tested block of memory.

In another embodiment, if a trigger condition exists, test management module 16 tests base memory block 42 and all memory test blocks A–I (44–60). Test management module 16 may then select the memory test block that will be tested during the next boot operation. After the completion of a test of base block 42 and all of the test blocks, as described above, test management module 16 may select the first sequential test block A 44 to be tested during the next boot operation. Test management module 16 may also use the data stored by block pointer 20 to determine the test block to be tested during the next boot operation.

FIG. 2 is a diagram of memory 14 associated with information handling system 10. In the present embodiment, test block assignment module 18 of management module 16 divides total memory 14 into base memory block 42 and a plurality of test memory blocks A–I 44–60. In the present preferred embodiment, test block assignment module 16 first determines the total amount of system memory 14. Based on the amount of total memory 14, test block assignment module 18 may divide memory 14 into multiple memory test blocks. In one embodiment, test management module 16 determines the total amount of memory 14. Test block assignment module 18 then designates the size of base memory block 42 as a selected first fraction of total memory. Test block assignment module 18 then designate the size of each memory test block as a second selected fraction of total memory.

In the present embodiment, base memory 42 is approximately one-tenth of the total memory 14. After designating base memory 42, test block assignment module 18 then divides the remaining memory 14 into test memory blocks A–I (44–60) where test memory blocks A–I (44–60) are each approximately one-tenth of memory 14. Test block assignment module 18 also preferably assigns the test memory blocks A–I (44–60) sequentially. For example, test block assignment module 18 labels test memory block 44 as block A and block 46 as block B. In the present embodiment, this sequential process continues test block assignment module 18 labels the last test memory block 60 as block I.

In another embodiment, the base memory block 42 may be one-sixteenth of total memory 40 and test block assignment module 18 divides memory 14 into sixteen blocks. In this embodiment, the first base memory block 42 and the fifteen additional blocks may be labeled as, for example, test memory blocks A–O. In other alternative embodiments, memory blocks may be any suitable fraction of total memory 14.

In yet another embodiment, test block assignment module 18 may divide memory 14 into memory blocks based on a set memory size. For example, it may divide memory 14 into set blocks of 256 megabytes (MB) or another selected size regardless of the size of memory 14.

In another embodiment, test block assignment module 18 may divide memory 14 into blocks based upon the processing speed of information handling system 10.

Now referring to FIG. 3, a flow diagram showing representative steps included in a boot operation for information handling system 10 is shown. A boot operation is typically composed of the power-on self-test (POST) routine, followed by the loading of operating system 36. The POST routine is necessary to ensure that all the hardware components, including the central processing unit 28 (CPU) and memory 14, are functioning properly. The POST routine ensures that information handling system 10 has the ability to carry out its tasks. This step is necessary before the computer loads operating system 36. Operating system 36 then makes information handling system 10's hardware interact with the software. Once operating system 36 loads, then information handling system 10 is ready for a user.

A boot operation for the purposes of this disclosure means any boot in which the BIOS starts to run the POST routine. A boot operation also specifically includes a so-called cold boot operation. For instance, a cold boot occurs when a user activates the information handling system 10's on-switch. Any boot from a so-called "S5" state is considered a boot or a cold boot for the purposes of this disclosure.

The boot operation begins at step 80. The boot starts when an electrical signal follows a path to CPU 28 and invokes the POST routine. The electrical signal resets CPU 28's register, or program counter to a specific number. In many cases, the hexadecimal number will be F000. F000 represents the first portion of the RAM used by information handling system 10 and is often the first megabyte of memory 14.

The boot proceeds to step 82 where information handling system 10 determines the size of memory 14. For example, the information handling system 10 may do this by communicating with all of the Dual in-line Memory modules (DIMMS) and determining the amount of memory 14 based on the information received.

At step 84, BIOS 12 then configures memory 14. Here, the information from step 82 is conveyed to test management module 16 and test block assignment module 18 as described above.

In step 86, CPU 28 copies the BIOS from its ROM chip to the address F000 on the RAM portion of memory 14. Here the BIOS runs out of RAM instead of ROM, which speeds the POST routine.

Next, a small, sufficient amount of memory is tested 88 in order to allow the video associated with information handling system 10 to run on display 30. In some embodiments, this amount of memory may be the first or second megabyte of memory 14. In another embodiment, the POST routine tests the memory contained on a display adapter to enable the video. Step 88 allows the POST routine to configure the video.

Step 90 initiates the video on display 30. After the video is ready, the POST routine then tests the rest of the memory 14 in step 92. In one embodiment, if the system is running its first or initial boot, then test management module 16 tests all the memory blocks of memory 14 and sets test block pointer 20 to block A (44). In instances where a trigger condition exists that would indicate a higher likelihood of corrupt memory, test management module 16 tests all the blocks of memory 14 and sets the test block pointer 20 to block A (44). In situations where no trigger condition exists and the boot operation is subsequent to an initial boot operation, test management module 16 tests base memory block 42 and a selected memory test block. In some embodiments, test block pointer 20 is then reset to the last-tested memory block. By testing only base block 42 and a selected memory block, step 92 significantly decreases in time compared with testing all of memory 14. As a result, the total POST time and boot time would significantly decrease.

This method allows for shorter boot times while maintaining a high level of integrity in memory 14 by always testing base memory block 42. Base memory block 42 is the portion of memory that is predominantly used by information handling system 10 and is used before other blocks of memory. The remaining test memory blocks A–I (44–60) are tested in rotation during subsequent boot operations.

Next, the POST routine then executes the peripheral component interconnect (PCI) configuration 94. The PCI configuration assesses the status all of the peripheral attachments associated with information handling system 10.

Next, hard drive 34 is initialized 96. Here the POST routine monitors the status of hard drive 34. In one embodiment, hard drive 34 is initialized in different parts throughout the POST routine. In an alternative embodiment, hard drive 34 is initialized in a single step (not expressly shown).

POST routine then enumerates the universal serial bus (USB) devices 98. Here the POST routine checks the mouse, keyboard 32, and other USB devices. Finally, the POST routine hands off to operating system 36 in 100. Operating system 36 connects the hardware of information handling system 10 with the software of information handling system 10. Once operating system 36 is finished loading, the boot is over and information handling system 10 is ready for use.

Now referring to FIG. 4, a schematic flow diagram showing a method for decreasing boot time in a boot is shown. The method begins 120 and test management module 16 associated with BIOS 12 divides memory 14 into base memory block 42 and a plurality of memory test blocks (see FIG. 2).

Next, trigger condition indicator 22 determines if a trigger condition is present. A trigger condition exists where there is a higher probability of an error or corruption in memory 14. In the present embodiment, steps 124, 132, 134, 136, 138 and 140 each determine whether a trigger condition exists. In the present embodiment, the first trigger condition checked for is whether this is information handling system 10's first boot 124. It is preferable to test all of memory 14 during an initial boot because it is unknown whether memory 14 has been tested before. If trigger condition indicator 22 determines that this is the first cold boot of information handling system 10, the method proceeds to a full memory test of all memory blocks 126. If trigger indicator 22 determines that this is not the first boot, the method proceeds to step 132.

After full memory test 126, test management module 16 sets test block pointer 20 to the first test memory block (such as block A as shown in FIG. 2) to be tested on the next boot 128. The method then proceeds to step 130 where the boot operation hands off to operating system 36 in 126.

If trigger indicator 22 determines that this is not the first boot, the method proceeds to step 132. At step 132, trigger condition indicator 22 determines whether a chassis intrusion has occurred. If there has been a chassis intrusion, there may be a higher probability that internal memory components have been added, changed or damaged. If trigger condition indicator 22 determines that there has been a chassis intrusion, then the method proceeds to step 126 where a full memory test is preformed. If trigger condition indicator 22 determines that there has been no chassis intrusion, then the method proceeds to step 134.

At step 134, trigger condition indicator 22 determines if the memory chip serial numbers have changed. Trigger condition indicator 22 may accomplish this by comparing the serial numbers recorded in past boot operations with the serial numbers detected in the present boot. Trigger condition indicator 22 may receive the serial numbers from information handling system 10 when it initially determines the size of memory 14. If there are new, missing, or different serial numbers, then one or more memory chips may have been added, removed or replaced. If there is an inconsistency detected in the memory serial number, then the method proceeds to step 126 where a full memory test is performed. If the memory serial numbers have not changed, then the method proceeds to step 136.

At step 136 trigger condition indicator 22 determines if the amount of memory is the same. If trigger indicator 22 determines that there is a different total memory since the last boot, the method continues to step 126 where a full memory test is preformed. If the total memory is the same size as it was in the last boot, then the method moves to step 138.

In step 138, trigger condition indicator 22 may determine to perform a full memory test if a selected number (N) of boots have occurred without a full memory test. This trigger condition automatically requires a full memory test if the selected number (N) of boot operations have been performed without a full memory test. Test management module 16 may record the number of boots without a full memory test. Trigger condition indicator 22 may read this recorded number, and once it reaches the designated number, it will trigger a full memory test, resetting the number of boots to zero. If N boots have occurred since the last full memory test, the method proceeds to step 126. If N boots have not occurred since the last full memory test, the method proceeds to step 140.

At step 140, trigger condition indicator 22 determines if there has been a lapse in a specified period (P) since the last boot with a full memory test. In one embodiment P is a selected number of days. In another embodiment, P may be selectively tied to a calendar date such as the first day of the month. Depending on the nature of P, trigger condition indicator 22 may monitor test management module 16 or other information handling system resources to determine whether P has been reached. If P has been reached, the method proceeds to step 126 and tests all memory. If P has not been reached, the method goes to step 142.

Upon reaching step 142, trigger condition indicator 22 has determined that no trigger conditions exist. In step 142, test management module 16 reads test block pointer 20 in order to determine the next test memory block to test. Test block pointer 20 may indicate the last memory test block tested, therefore the next block to be tested is the next sequential test memory block. Alternatively, test block pointer 20 may indicate the next test memory block to be tested. The present disclosure contemplates either embodiment. Once test management module 16 identifies the next test memory block to be tested, the method proceeds to memory testing.

Step 144 tests the base memory block. Step 146 then tests the next memory test block indicated in step 142.

At step 148, test management module 16 sets test block pointer 20 to the last memory test block tested. Alternatively, as described above, test management module 16 may set test block pointer 20 to the next memory test block to be tested during the next boot. For instance, if the last test memory block tested in step 146 was block C (48), the pointer may set test block pointer 20 to block D (50). If step 146 tested block I (60), then the pointer may set test block pointer 20 to block A (44).

The method then ends at step 130. Here, after the pointer has been set, and other BIOS operations are complete, information handling system 10 hands off to operating system 36. Once operating system 36 is loaded, the information handling system 10 is preferably available for use.

Although the disclosed embodiments have been described in detail, it should be understood that various changes, substitutions and alterations can be made to the embodiments without departing from their spirit and scope.

What is claimed is:

1. An information handling system comprising:
a BIOS having a test management module;
a memory;
the BIOS in communication with the memory and operable to test the memory;
the test management module operable to:
divide the memory into a base memory block and a plurality of memory test blocks; and
test the base memory block and test a selected memory test block during a boot operation.

2. The information handling system of claim 1 wherein the memory comprises system RAM.

3. The information handling system of claim 1 further comprising the BIOS operable to perform data testing and address testing on the memory.

4. The information handling system of claim 1 further comprising the management module operable to:
   determine the total amount of memory;
   designate the size of the base memory block as a selected first fraction of total memory; and
   designate the size of each memory test block as a selected second fraction of total memory.

5. The information handling system of claim 4 wherein the base memory is approximately one-tenth of the total memory.

6. The information handling system of claim 4 wherein the base memory is approximately one-sixteenth of the total memory.

7. The information handling system of claim 1 further comprising the test management module operable to initiate a test of the complete memory in response to a trigger condition.

8. The information handling system of claim 7 further comprising the trigger condition selected from the group consisting of:
   a chassis intrusion, a change in memory serial number, a change total memory, a detected thermal incident, a lapse of a selected period, and a lapse of a selected number of consecutive cold boots without a complete memory test.

9. The information handling system of claim 7 further comprising the trigger condition comprising a first cold boot.

10. The information handling system of claim 1 further comprising:
    the test management module operable to divide the memory into the base memory and a series of memory test blocks;
    the test management module further operable to select the next consecutive memory test block for testing during each boot operation.

11. The information handling system of claim 10 wherein the boot operation comprises a cold boot.

12. A test management module for an information handling system comprising:
    a test block assignment module operable to divide a memory into a base memory block and a plurality of sequential memory test blocks;
    a test block pointer operable to record the most recently tested memory test block;
    a trigger condition indicator operable to determine whether a trigger condition exists; and
    the test management module operable to test the base memory block and a selected memory test block during a boot operation.

13. The test management module of claim 12 further comprising the test management module operable to test all memory blocks where the trigger condition indicator determines that a trigger condition exists.

14. The test management module of claim 12 further comprising the test management module operable to test the next sequential test block where the trigger condition indicator determines that no trigger condition exists.

15. The test management module of claim 12 further comprising the trigger condition selected from the group consisting of:
    a first boot, a chassis intrusion, a change in memory serial number, a change total memory, a detected thermal incident, a lapse of a selected period and a lapse of a selected number of consecutive cold boots without a complete memory test.

16. A method to decrease boot time in a cold boot of an information handling system, the method comprising:
    dividing a memory into a base memory block and a plurality of memory test blocks;
    selecting a memory test block for testing;
    testing the base memory block;
    testing the memory test block.

17. The method of claim 16 further comprising:
    determining whether a trigger condition exists; and
    reading a test block pointer identifying next test memory block to test.

18. The method of claim 17 further comprising testing all memory test blocks and setting the pointer to the first memory test block if a trigger condition is determined.

19. The method of claim 17, further comprising testing the memory test block indicated by the pointer and setting the pointer to the next sequential memory test block.

20. The method of claim 17 further comprising the trigger condition selected from the group consisting of:
    a chassis intrusion, a change in memory serial number, a change total memory, a detected thermal incident, a lapse of a selected period and a lapse of a selected number of consecutive cold boots without a complete memory test.

* * * * *